US009196624B2

(12) United States Patent
Davis et al.

(10) Patent No.: US 9,196,624 B2
(45) Date of Patent: Nov. 24, 2015

(54) LEAKAGE REDUCING WRITELINE CHARGE PROTECTION CIRCUIT (75) Inventors: Bradley Marc Davis, Mountain View, CA (US); Mark W. Randolph, San Jose, CA (US); Sung-Yong Chung, Davis, CA (US); Hidehiko Shiraiwa, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 53 days.

(21) Appl. No.: 13/545,469

(22) Filed: Jul. 10, 2012

(65) Prior Publication Data

US 2014/0015138 A1    Jan. 16, 2014

(51) Int. Cl.
*H01L 21/336* (2006.01)
*H01L 27/115* (2006.01)
*H01L 21/28* (2006.01)

(52) U.S. Cl.
CPC ..... *H01L 27/11521* (2013.01); *H01L 21/28273* (2013.01)

(58) Field of Classification Search
None
See application file for complete search history.

(56) References Cited

U.S. PATENT DOCUMENTS

| 6,017,792 | A   |   | 1/2000  | Sharma et al.       |         |
|-----------|-----|---|---------|---------------------|---------|
| 6,031,249 | A   | * | 2/2000  | Yamazaki et al.     | 257/66  |
| 6,380,031 | B1  |   | 4/2002  | Mehrad et al.       |         |
| 7,160,773 | B2  |   | 1/2007  | Randolph            |         |
| 7,196,369 | B2  |   | 3/2007  | Chou et al.         |         |
| 7,352,610 | B1  | * | 4/2008  | Pedersen et al.     | 365/154 |
| 2004/0037147 | A1 |  | 2/2004  | Kuo et al.          |         |
| 2005/0250278 | A1 | * | 11/2005 | Randolph            | 438/210 |
| 2006/0030089 | A1 | * | 2/2006  | Chung               | 438/151 |
| 2008/0151590 | A1 | * | 6/2008  | Rogers et al.       | 365/52  |

OTHER PUBLICATIONS

Definition of Conductive, (Merriam Webster's Dictionary, http://www.merriam-webster.com/medical/conductive; 2015).*
International Search Report and Written Opinion of the International Searching Authority for International Application No. PCT/US2013/049574, mailed Sep. 30, 2013.

* cited by examiner

*Primary Examiner* — Minh-Loan Tran
*Assistant Examiner* — Shaka White (57) ABSTRACT Methods and systems of fabricating a wordline protection structure are described. As described, the wordline protection structure includes a polysilicon structure formed adjacent to a memory core region. The polysilicon structure includes first doped region positioned on a core side of the polysilicon structure and a second doped region positioned on a spine side of the polysilicon structure. An un-doped region positioned between the first and second doped regions. A conductive layer is formed on top of the polysilicon structure and arranged so that it does not contact the un-doped region at either the transition between the first doped region and the un-doped region or the second doped region and un-doped region.

20 Claims, 11 Drawing Sheets

LEAKAGE REDUCING WRITELINE CHARGE PROTECTION CIRCUIT

BACKGROUND OF THE INVENTION

1. Field of the Invention

The invention relates generally to an improved write line charge protection circuit for use in memory devices and the method for manufacturing the write line charge protection circuit.

2. Related Art

Flash and other types of electronic memory devices are constructed of memory cells that individually store and provide access to data. A typical memory cell stores a single binary piece of information referred to as a bit, which has one of two possible states. The cells are commonly organized into multiple cell units such as bytes which comprise eight cells, and words that may include sixteen or more such cells, usually configured in multiples of eight. Storage of data in such memory device architectures is performed by writing to a particular set of memory cells, sometimes referred to as programming the cells, where the data can then be retrieved in a read operation. In addition to programming and read operations, groups of cells in a memory device may be erased, wherein each cell in the group is programmed to a known state.

The individual memory cells typically comprise a semiconductor structure adapted for storing a bit of data. For instance, many conventional memory cells include a metal oxide semiconductor (MOS) device in which a binary piece of information may be retained. The erase, program, and read operations are commonly performed by application of appropriate voltages to certain terminals of the cell MOS device. In an erase or program operation the voltages are applied so as to cause a charge to be removed or stored in the memory cell. In a read operation, appropriate voltages are applied to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a non-volatile type of memory that can be rewritten and hold its content without power. Conventional flash memories are constructed in a cell structure, wherein a single bit of information is stored in each flash memory cell. Each flash memory cell includes a transistor structure having a source, a drain, and a channel in a substrate or, as well as a stacked gate structure overlying the channel. The stacked gate may include a gate dielectric layer (sometimes referred to as a tunnel oxide) formed on the surface of the p-type conductivity, for example, disposed in the substrate as commonly known by a person having ordinary skill in the art. The stacked gate also includes a polysilicon floating gate overlying the tunnel oxide and an interpoly dielectric layer overlying the floating gate. The interpoly dielectric layer is often a multilayer insulator, such as an oxide-nitride-oxide (ONO) layer, having two oxide layers sandwiching a nitride layer. Lastly, a doped polysilicon control gate overlies the interpoly dielectric layer.

Flash memory cells are organized into individually addressable units or groups such as bytes or words, which are accessed for read, program, or erase operations through address decoding circuitry, whereby such operations may be performed on the cells within a specific byte or word. The memory device includes appropriate decoding and group selection circuitry to address such bytes or words, as well as circuitry to provide voltages to the cells being operated on in order to achieve the desired operation. The flash memory cells, whether single bit or multiple-bit, may be interconnected in a variety of different configurations. For instance, cells may be configured in a NOR configuration, with the control gates of the cells in a row individually connected to a wordline and the drains of the cells in a particular column connected together by a conductive bitline, in such an arrangement, all the flash cells in the array have their source terminals coupled to a common source terminal, such as Vss or ground. In operation, individual flash cells in such a NOR configuration are addressed via the respective bitline and wordline using peripheral decoder and control circuitry for programming (writing), reading, erasing, or other functions.

Another cell configuration is known as a virtual ground architecture, in which the control gates of the core cells in a row are tied to a common wordline. A typical virtual ground architecture comprises rows of flash memory core cell pairs with a drain of one cell transistor coupled to an associated bitline and to the source of the adjacent core cell transistor. An individual flash cell is selected via the wordline and a pair of bitlines bounding the associated cell. A cell may be read by applying voltages to the control gate (e.g., via the common wordline) and to a bitline coupled to the drain, while the source is coupled to ground (Vss) via another bitline. A virtual ground is thus formed by selectively grounding the bitline associated with the source of the cells that are to be read. Where the core cells are of a dual-bit type, the above connections can be used to read a first bit of the cell, whereas the other bit may be similarly read by grounding the bitline connected to the drain, and applying a voltage to the source terminal via the other bitline.

In the course of manufacturing flash memory devices, certain processing steps involve the use of electrically charged plasma. For instance, ion implantation, plasma etching, plasma enhanced deposition processes and other charged processing operations may damage semiconductor wafers, and the flash memory cells therein. The plasma in such processes includes charged particles, some of which may accumulate on the wafer surface through antenna charging. For example, in back-end interconnect processing, inter layer dielectric (ILD) material is often deposited using plasma enhanced chemical vapor deposition (PECVD) and etched using plasma based reactive ion etching (RIE). In flash memory arrays, the conductive control gate structures are commonly formed as lines of doped polysilicon disposed along rows of cells, which operate as wordlines to selectively access the rows of data stored therein. The polysilicon control gates or wordlines operate as antennas with respect to process-related charging, including process steps involving plasma. If unprotected, the wordline structures accumulate charge and acquire a voltage potential with respect to the wafer substrate, which can discharge through the stacked gate or charge trapping layer, leading to preprogramming or damage of the cells.

Even after the doped polysilicon wordlines are covered with ILD material, process-related charging may cause cell damage. For instance, during back-end interconnect (e.g., metalization) processing, one or more patterned metal layers are formed over and between ILD layers, some of which are connected to the wordlines in the flash array. These metal wordline routing structures may themselves be directly exposed to back-end processes, and operate as charge gathering antennas, where charge accumulating on exposed wordline connections can discharge through the flash memory cells, again leading to damage and/or performance degradation. Wordline protection apparatus and methods are desirable for the manufacture of flash memory devices to inhibit the adverse effects of process-related charging. One example of such a wordline protection structure is fully explained in U.S. Pat. No. 7,160,773, which is incorporated herein by reference in its entirety.

Flash memory is typically tested to determine whether any of the wordlines suffer from current leakage. Accurately determining the amount of current leakage is important because it allows a determination to be made about whether a particular memory cell or sector is functioning properly. Inaccurate current leakage measurements can result in either properly-functioning memory being rejected or in faulty memory being passed. It has been determined that, under certain situations, prior art memory with certain wordline protection structures result in inaccurate measurements of current leakage. Accordingly, improvements are needed to provide memory that allows for accurate measurements of current leakage.

BRIEF SUMMARY OF THE INVENTION

Embodiments of the invention include a method of fabricating a wordline structure in a flash memory device. According to the method, a polysilicon structure is formed adjacent to a memory core region. The polysilicon structure can then be doped in a first region that is adjacent to the core region and in a second region that is adjacent to a spine region. An un-doped region is left between the first and second regions. According to various embodiments, the un-doped region has a first end that is in contact with the first region and a second end that is in contact with the second region. According to aspects of the invention, a conductive layer can be formed on top of the polysilicon structure so that it does not contact at least one of the first end and the second end. According to various embodiments, the conductive layer can be formed by forming a mask over a portion of the un-doped region, disposing the conducive layer on the un-masked region of the polysilicon structure, and then removing the mask.

According to aspects of the invention, a semiconducting device is provided. The semiconducting device includes a core region, a spine region, a polysilicon structure, and a conductive layer. The polysilicon structure may be formed adjacent to the core region. Additionally, the polysilicon structure can include a second doped region that is adjacent to the spine region, and an un-doped region positioned between the first and second doped regions. The un-doped region can have a first end in contact with the first doped region and a second end in contact with the second doped region. A conductive layer may be formed on top of the polysilicon structure and arranged such that it does not contact at least one of the first end and the second end.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGURES

Embodiments of the invention will now be described, by way of example only, with reference to the accompanying schematic drawings in which corresponding reference symbols indicate corresponding parts. Further, the accompanying drawings, which are incorporated herein and form part of the specification, illustrate the present invention, and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

The following detailed description of the present invention refers to the accompanying drawings that illustrate exemplary embodiments consistent with this invention. Other embodiments are possible, and modifications can be made to the embodiments within the spirit and scope of the invention. Therefore, the detailed description is not meant to limit the invention. Rather, the scope of the invention is defined by the appended claims.

Figure 1:
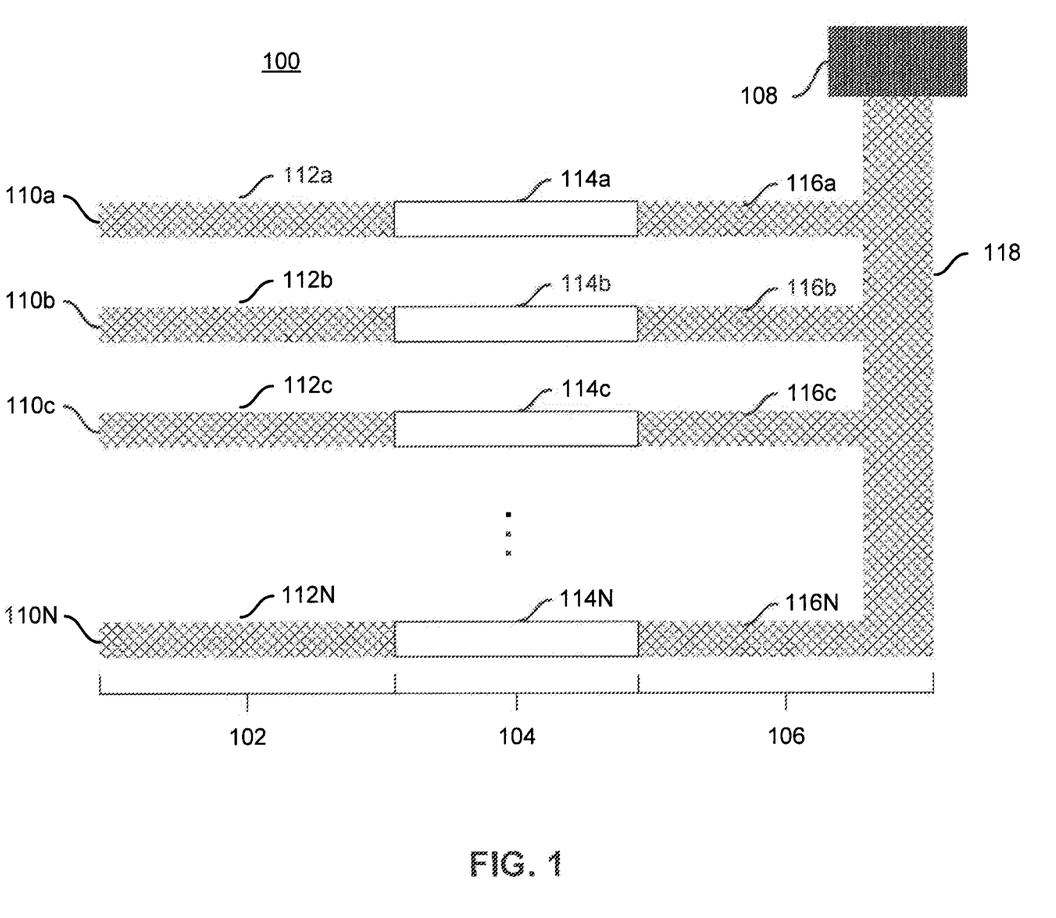
FIG. 1 depicts a semiconducting device according to embodiments of the present invention.

FIG. 1 depicts a semiconducting wordline protection structure 100 according to various embodiments of the invention. The structure 100 includes a number of wordlines 110a-110N (collectively referred to as wordlines 110) which are connected to each other at a spine 118. The spine 118 is electrically connected to the substrate via interconnect 108 according to various embodiments.

Each of the wordlines can be thought of having three regions according to various embodiments. For instance, wordline 110a contains within it a doped region 112a adjacent to a core side (e.g., on the left, but not shown), an un-doped region 114a, and a doped region 116a adjacent to the spine 118. The other wordlines (i.e., 110b, 110c . . . , 110N) have similar core-side doped regions (112b, 112c . . . , 112N) and spine-side doped regions (i.e. 116b, 116c . . . , 116N). The core-side doped regions (112a, 112b, 112c . . . , 112N) are generically referred to as cored-side doped regions 112 herein. Similarly, un-doped regions (114a, 114b, 114c . . . , 114N) and spine-side doped regions (116a, 116b, 116c . . . , 116N) are generically referred to as un-doped regions 114 and spine-side doped regions, respectively.

Doped regions 112 and 116 may be covered with a conductive layer (e.g., Co—Si), whereas the un-doped region 114 may be totally uncovered or at least partially uncovered by the conductive layer according to various embodiments. The un-doped region 114, while preferably slightly conductive, has a significantly higher resistance than doped regions 112 and 116. The wordline structure 100 has a core-adjacent region 102, an un-doped region 104, and a spine-adjacent region 106, according to various embodiments.

Figure 2A:
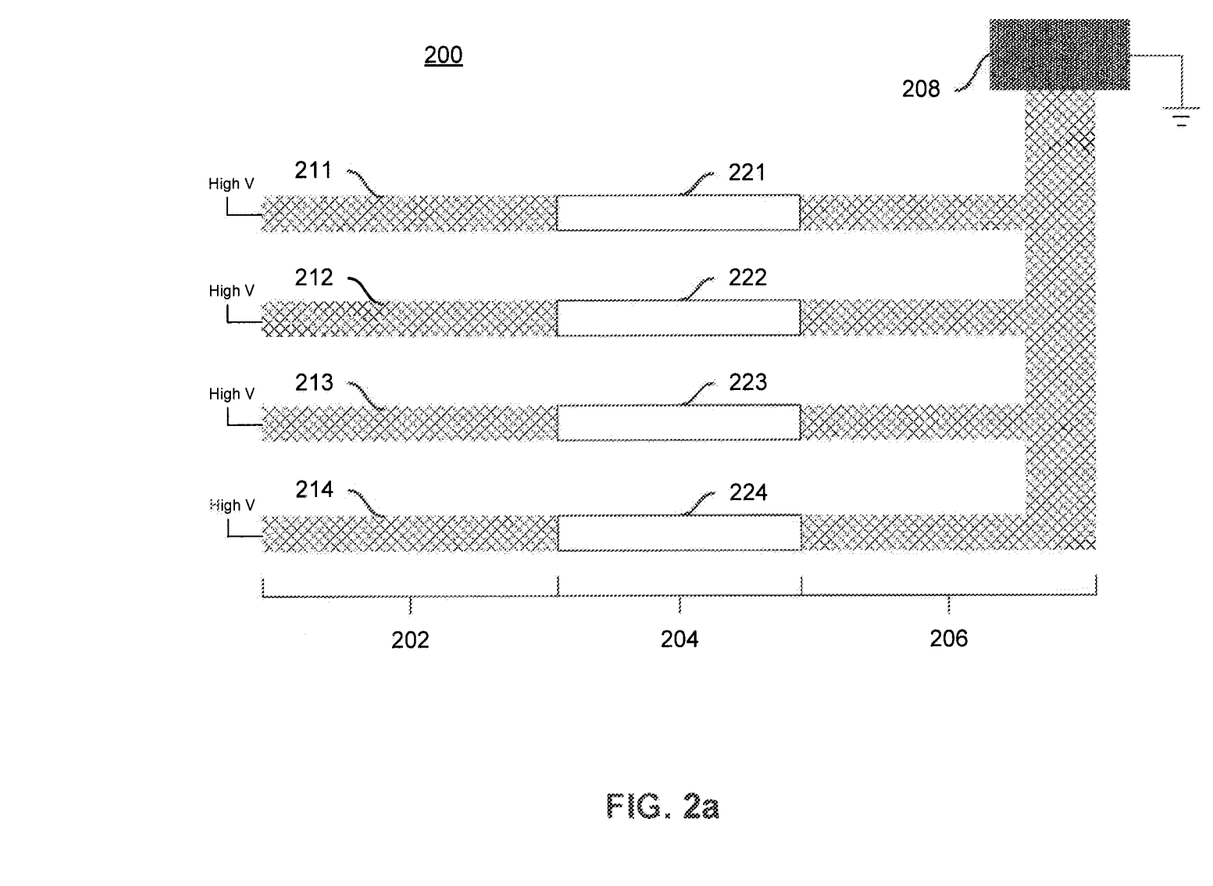
FIGS. 2a-2b depict a semiconducting device according to embodiments of the present invention.
Figure 2B:
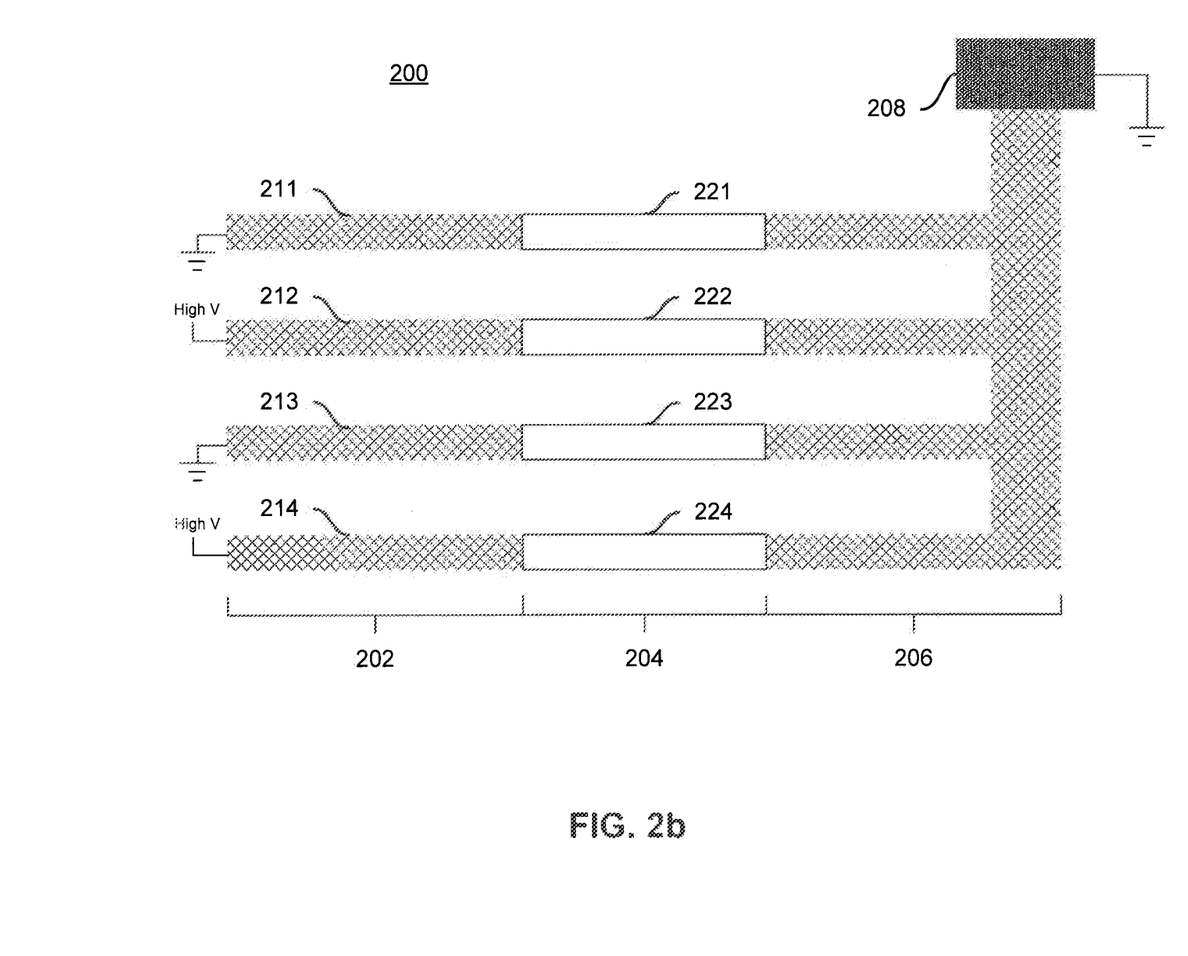

FIGS. 2a and 2b depict an exemplary wordline protection circuit 200 according to aspects of the invention. For simplicity, circuit 200 is depicted with only four wordlines 211, 212, 213, and 214, however, in practice, such a structure could have many more wordlines. Each wordline has a portion located in a doped core region 202, an un-doped region 204, and a doped spine region 206. The spine is electrically connected to substrate via connection 208. Additionally, each wordline has a respective masked region 221, 222, 223, and 224. The un-doped region of each wordline, while slightly conductive, preferably has a much higher resistance than the relatively conductive doped regions 202 and 206.

Leakage of wordline protection circuit 200 can be tested in two phases. The first phase is depicted in FIG. 2a and the second phase is depicted in FIG. 2b. As shown in FIG. 2a, during the first phase, each of the wordlines 211, 212, 213, and 214 is connected to high voltage supply (e.g., 10 V) at the core region 202. The substrate (and therefore the connection 208) can be connected to low voltage, or ground as shown. An initial or first-phase current leakage can then be measured at this point by measuring the current flowing from the voltage supply to ground.

FIG. 2b depicts a second phase of leakage testing. During this second phase of leakage testing only a portion of the wordlines 211, 212, 213, and 214 are connected to the high voltage supply. For instance, FIG. 2b depicts half of the wordlines (212 and 214) set to high voltage and the other half (211 and 213) set to ground, but other configurations are possible. A final or second-phase current leakage can then be measured at this point by measuring the current flowing from the voltage supply. Ideally, if the wordlines are free from defects, the final value should be half of the initially measured current leakage value (assuming, as depicted in FIG. 2b, that half of the wordlines are set to high and half to ground). However, if the measured second-phase current is higher than expected, a defect due to wordline to wordline leakage can be assumed and remedied by repairing it or replacing the structure with an appropriate back-up structure. Inaccurate leakage measurements, however, can cause false defect detections or cause defects to go undiagnosed. This phenomenon will be further explained in connection with FIG. 3.

Figure 3:
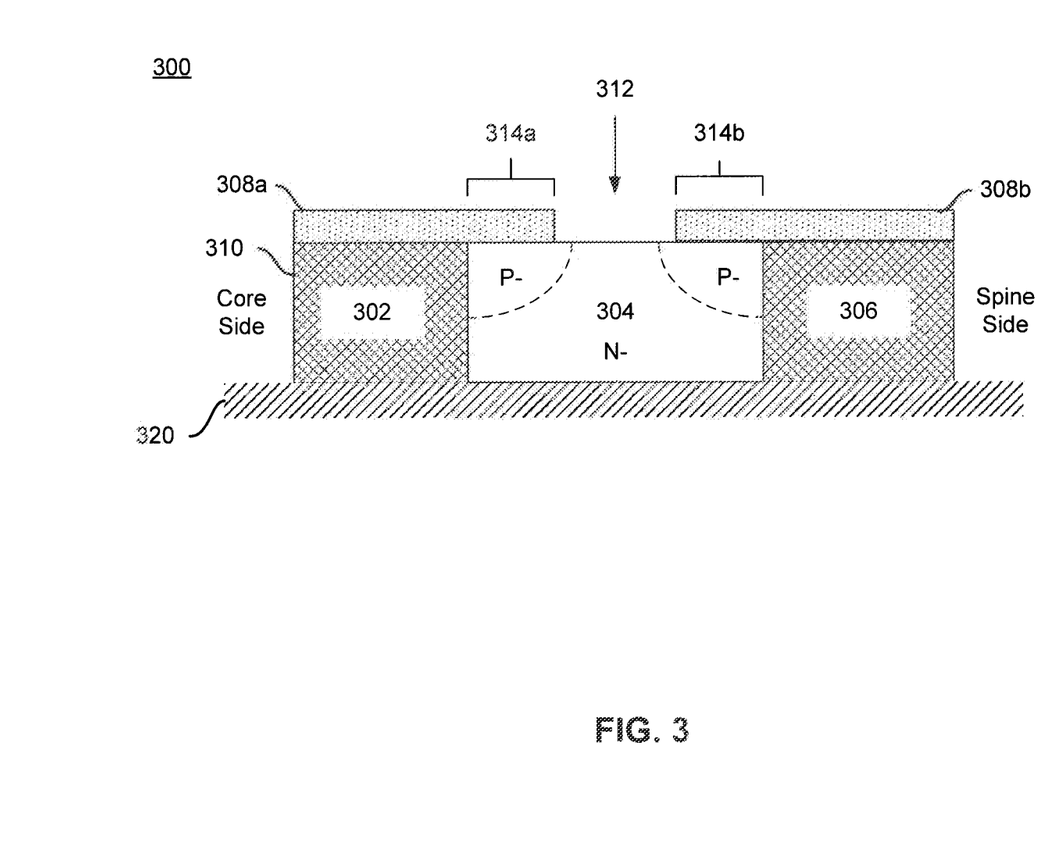
FIG. 3 depicts a semiconducting device according to embodiments of the present invention.

FIG. 3 depicts a side view of an exemplary semiconductor structure 300 that includes a wordline 310 similar to the wordlines 211-214 depicted in FIGS. 2a and 2. As shown, wordline 310 is disposed on substrate 320 and preferably formed from polysilicon and includes a doped core-side region 302, an un-doped region 304, and a doped spine-side region 306. The structure also includes conductive layers 308a and 308b, preferably formed from Co—Si. A masked region 312 results from masking during the production process to prohibit the formation of the conductive layer over a portion of the un-doped region 304. As depicted in FIG. 3, conductive layer 308a has a portion 314a that overlaps the un-doped region 304. Similarly, conductive layer 308b has a portion 314b that overlaps the un-doped region 304. While region 304 is un-doped, under certain circumstances, portions of region 304 can be induced to behave like weak P and N regions. For instance, when adjacent wordlines are held high, P and N-type regions can be formed in region 304 causing it to behave like a transistor. FIG. 3 depicts one situation where P- and N-regions are formed in the un-doped region 304. However, the region depicted as N- could also be a P-region in some instances.

The inventors have identified a problem has been identified with structure 300 that occurs when adjacent wordlines are held high (such as during the testing described with respect to FIGS. 2a and 2b). The transistor formed in the un-doped region 304 (and illustrated by the P? and N-regions within region 304) has the effect of modulating the measured leakage thereby leading to inaccurate current leakage testing results. To eliminate this problem, the inventors have determined that the structure 300 can be modified to eliminate one or both of the overlap portions 314a and 314b. The process for making an improved structure according to the present invention is described, below, with reference to FIGS. 4a-4f.

Figure 4A:
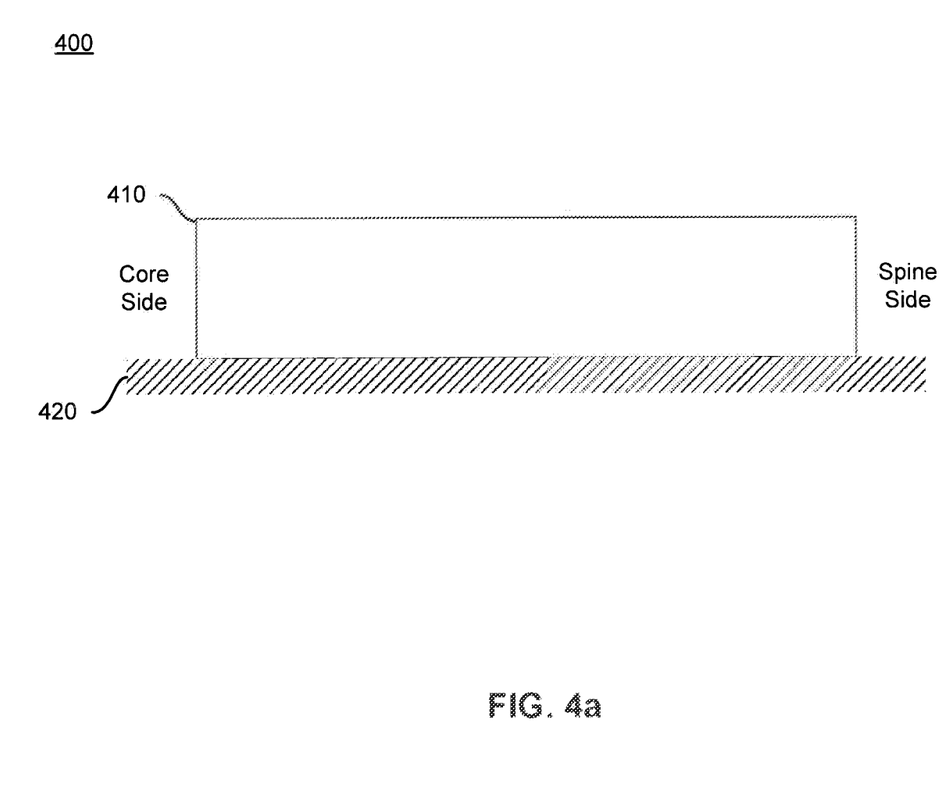
FIGS. 4a-4f depict a semiconducting device at various points in its manufacture according to embodiments of the present invention.

FIG. 4a depicts a semiconducting section 400. Specifically, a polysilicon layer 410 has been formed between a core side and a spine side of larger a semiconducting structure (the entire structure is not shown). The polysilicon layer can be disposed on a substrate 420 through any of a number of well-known processes such as physical vapor deposition (PVD), chemical vapor deposition (CVD), electrochemical deposition (ECD), molecular beam epitaxy (MBE), plasma enhanced chemical vapor deposition (PECVD), or the like, according to various embodiments. The substrate 420 may be formed of any appropriate substrate material such as silicon wafer, SOI wafer, epitaxial layer, etc.

Figure 4B:
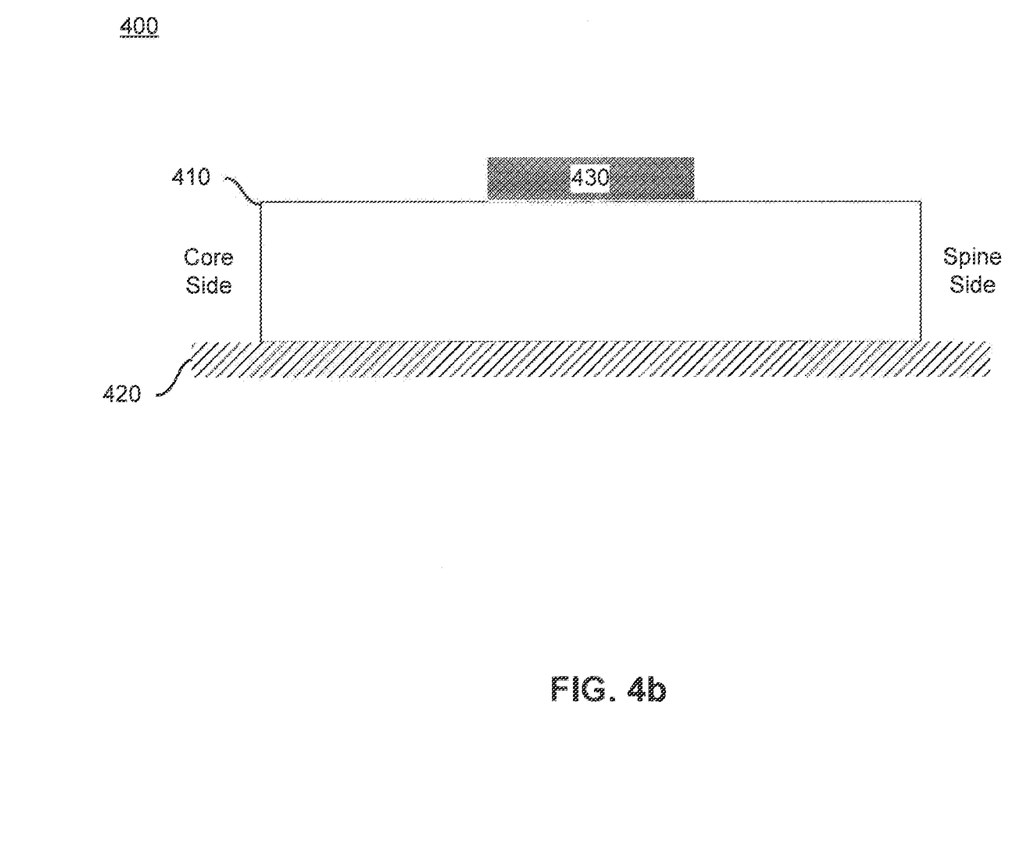
Figure 4C:
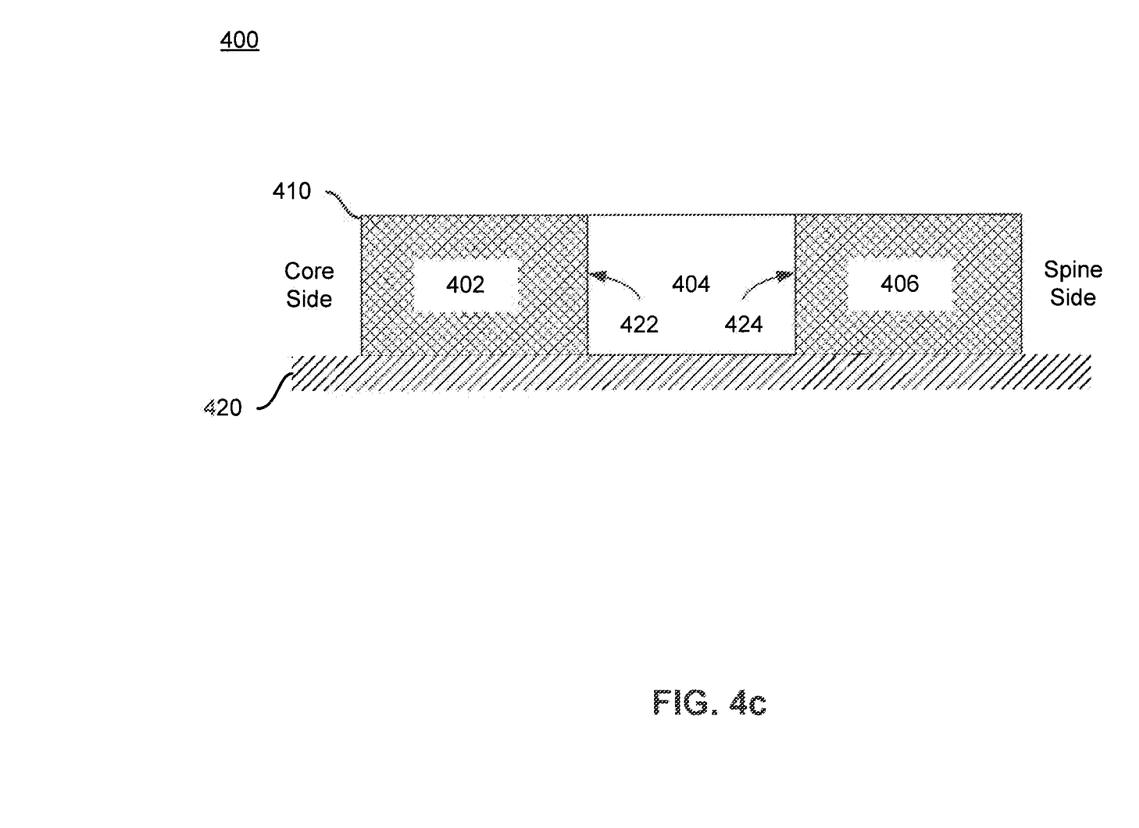

FIG. 4b depicts a dope mask 430 is disposed on the polysilicon layer 410. The polysilicon layer 410 can then be doped and dope mask 430 removed, which results in the structure depicted in FIG. 4c. FIG. 4c shows the polysilicon layer 410 now containing a doped region 402 on the core side and a doped region 406 on the spine side of the structure. An un-doped region 404 remains between the doped regions 402 and 406 and borders core side doped region 402 at transition 422 and borders spine side doped region 406 at transition 424.

Figure 4D:
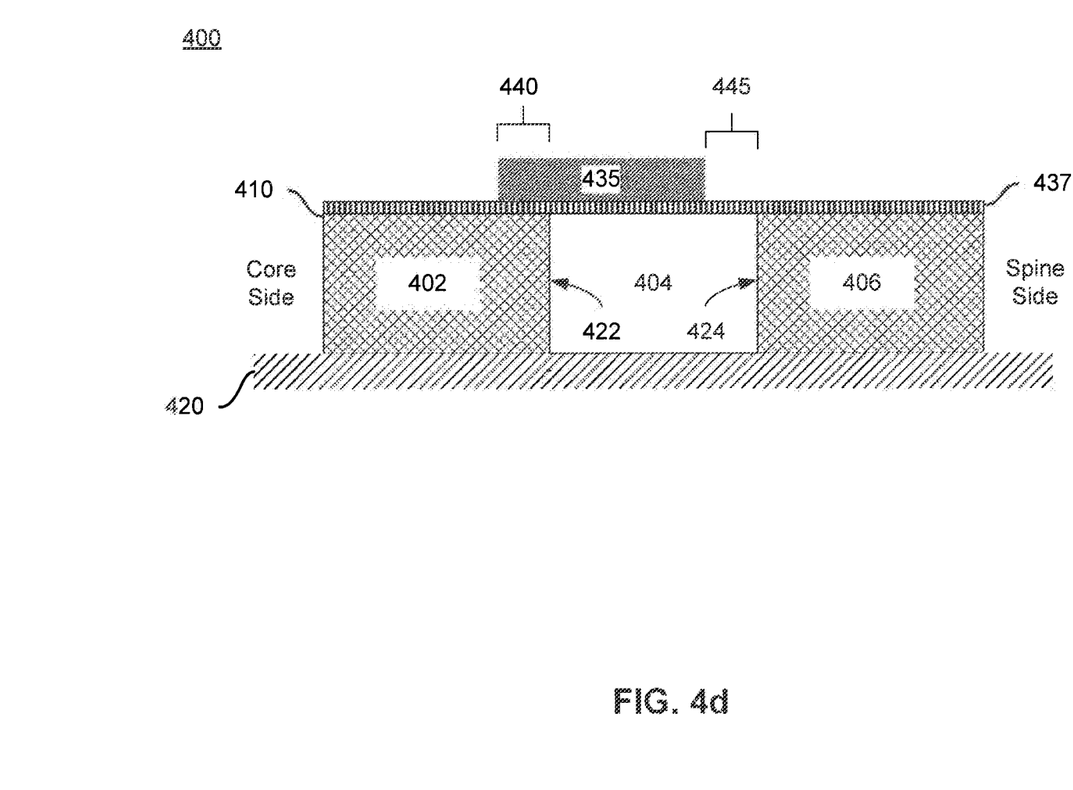

FIG. 4d depicts the semiconducting structure 400 with the addition of a conductive layer mask or silicide block (SB) mask 435. The conductive layer or silicide block (SB) mask 435 extends over a portion of the core-side doped region 402 by overhang portion 440 and over a portion un-doped region 404. Additionally, according to various embodiments, the conductive layer mask does not extend over the entirety of the un-doped region 404. For instance, as shown in FIG. 4d, the mask 435 leaves portion 445 of un-doped region 404 unmasked. However, according to some embodiments, the entirety of the un-doped region 404 can be masked with mask 435. Alternatively, masks 435 can extend over a portion of spine-side doped region 406.

Figure 4E:
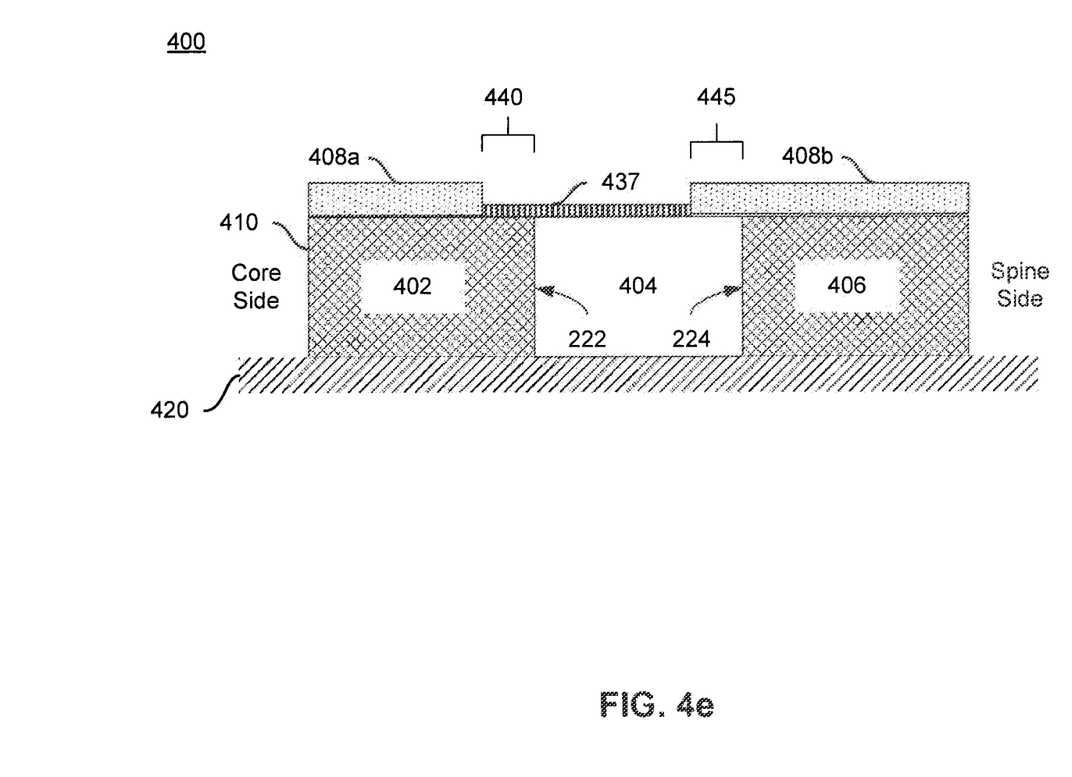

After masking at least a portion of the un-doped region, the semiconducting structure can be etched to remove a nitride layer 437 that has been formed from the unmasked portions. The mask can then be removed leaving a nitride layer 437 only in the masked portion—i.e., the portion where no conductive layer is desired. A conductive layer 408a and 408b can be disposed on top of the semiconducting structure 400 as depicted in FIG. 4e. The conductive layer 408a 408b can be created using any of a number of well-known processes such as physical vapor deposition (PVD), chemical vapor deposition (CVD), electrochemical deposition (ECD), molecular beam epitaxy (MBE), plasma enhanced chemical vapor deposition (PECVD), or the like, according to various embodiments. According to various embodiments the core-side overhang 440 of the mask 435 is sufficient to prevent any formation of conductive layer 408a over any portion of un-doped region 404. Additionally, mask 435 may be arranged to prevent the formation of any conductive layer 408b over any portion of un-doped region 404 (but not shown here).

Figure 4F:
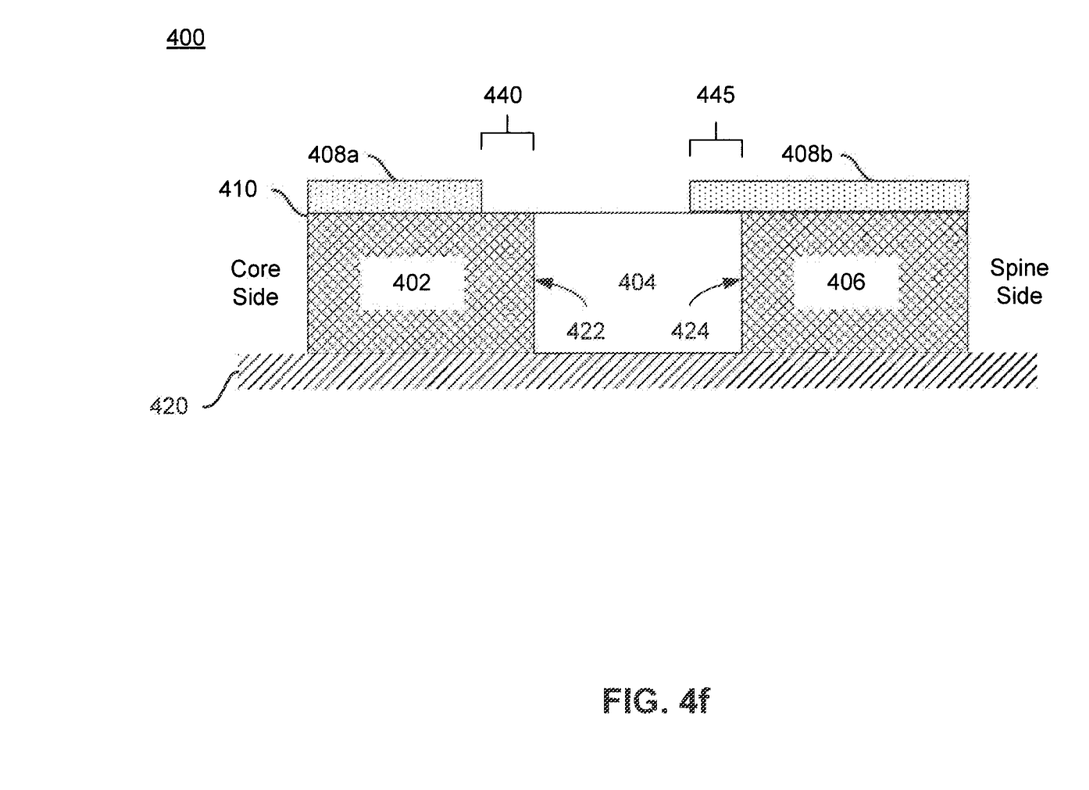

After the formation of the conductive layers 408a and 408b, the remaining nitride layer 437 can be removed. The resulting structure is depicted in FIG. 4f. As shown in FIG. 4f, conducing layer 408b overhangs un-doped region 404 by overhang 445. Also, there is a gap 440 between conducting layer 408a and un-doped region 404 such that there is no connection between the two. By preventing direct contact of at least one of the conducting layers 408*a* and 408*b* with the un-doped region 404, the structure 400 prevents the formation of the parasitic transistor discussed above with respect to FIG. 3.

Figure 5:
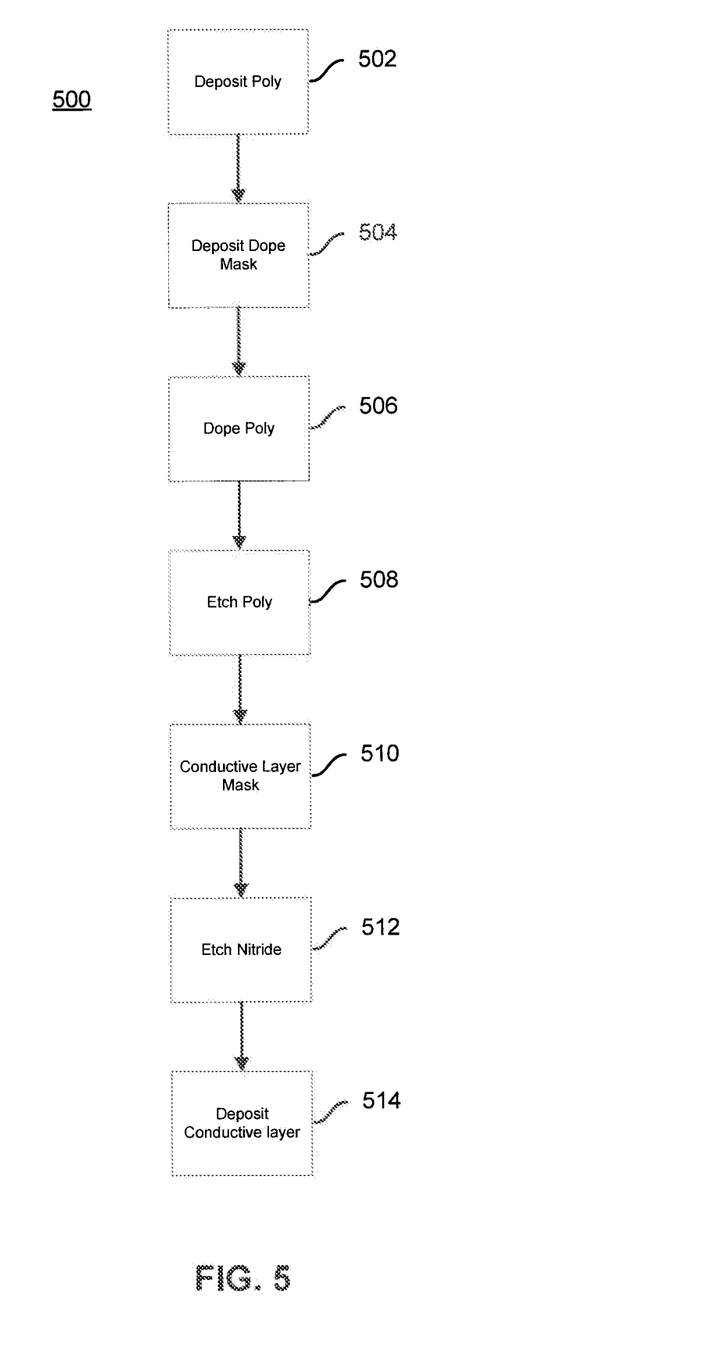
FIG. 5 is a flow chart depicting various steps in manufacturing a semiconducting device according to embodiments of the present invention.

FIG. 5 depicts a method of constructing a wordline protection circuit according to various embodiments of the invention. As shown, a polysilicon layer is deposited on a semiconductor substrate (e.g., silicon wafer, SOI wafer, epitaxial layer, etc.) at step 502. According to embodiments, the polysilicon layer can be deposited between a core region and a spine-side region. At step 504 a dope mask can be deposited on the polysilicon layer. The dope mask preferably leaves a portion of the polysilicon layer on the core side un-masked and a portion of the polysilicon layer on the spine side unmasked while masking a portion of the polysilicon layer between the two unmasked portions.

After disposing the dope mask on the polysilicon layer, the polysilicon layer can be doped in the regions not covered by the dope mask at step 506. The poly silicon layer can then be etched and the dope mask removed at step 508. The resulting polysilicon layer comprises a core side doped region, a spine side doped region, and an un-doped region positioned between the two doped regions.

At step 510, a conductive layer mask or SB mask is deposited on the polysilicon structure. Preferably, the conductive layer mask extends over at least a portion of the un-doped region. Additionally, the conductive layer mask may also extend over a portion of core side doped region. The mask may also extend over the entire un-doped region and also over-lap both of the core side doped region and the spine side doped region according to various embodiments. Once the conductive layer mask, a previously-placed layer of nitride can be removed from the unmasked portions at step 512, which leaves nitride only over the portion that has been masked. The conductive layer can then be deposited at step 514 onto the unmasked portion.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of fabricating a wordline structure for a flash memory cell, the method comprising:
    forming a polysilicon structure adjacent to a core region;
    doping the polysilicon structure in a first region adjacent to the core region and in a second region adjacent to a spine region;
    leaving an un-doped region between the first and second regions, the un-doped region having a first end in contact with the first region and a second end in contact with the second region; and
    forming a conductive layer directly on a portion of the un-doped region and one of the first and second regions of the polysilicon structure and arranged such that the conductive layer does not overlap at least one of the first end and the second end.

2. The method of claim 1, wherein forming a conductive layer comprises:
    forming a mask over a portion of the un-doped region; and
    disposing the conductive layer on the un-masked region of the polysilicon structure.

3. The method of claim 2, further comprising forming the mask so as to extend over a portion of the first region and a portion of the un-doped region.

4. The method of claim 2, further comprising forming the mask so as to extend over a portion of the first region and the entire un-doped region.

5. The method of claim 2, further comprising forming the mask so as to extend over a portion of the second region and a portion of the un-doped region.

6. The method of claim 2, further comprising forming the mask so as to extend over a portion of the first region, a portion of the second region, and the entire un-doped region.

7. The method of claim 1, further comprising forming at least a portion of the spine region from the second region and electrically connecting the spine region to a substrate.

8. The method of claim 1, wherein forming the polysilicon structure comprises:
    disposing polysilicon adjacent the core region;
    forming a dope mask over a portion of the disposed polysilicon;
    doping an un-masked portion of the polysilicon; and
    removing the dope mask.

9. The method of claim 1, further comprising forming the conductive layer from Co—Si.

10. The method of claim 1, further comprising forming a Flash memory cell in the core region.

11. A semiconducting device, comprising:
    a core region;
    a spine region;
    a polysilicon structure formed adjacent to the core region, wherein the polysilicon structure comprises a first doped region adjacent to the core region, a second doped region adjacent to the spine region, and an un-doped region positioned between the first and second doped region, wherein the un-doped region has a first end in contact with the first doped region and a second end in contact with the second doped region; and
    a conductive layer formed directly on a portion of the un-doped region and one of the first and second doped regions of the polysilicon structure and arranged such that the conductive layer does not overlap at least one of the first end and the second end.

12. The semiconducting device of claim 11, further comprising a masked region located over at least a portion of the un-doped region and formed by masking a portion of polysilicon structure and depositing the conductive layer on the un-masked region of the polysilicon structure.

13. The semiconducting device of claim 12, wherein the masked region extends over a portion of the first region and a portion of the un-doped region.

14. The semiconducting device of claim 13, wherein the masked region extends over the entire un-doped region.

15. The semiconducting device of claim 12, wherein the masked region extends over a portion of the second region and a portion of the un-doped region.

16. The semiconducting device of claim 12, wherein the masked region extends over a portion of the first region, a portion of the second region, and the entire un-doped region.

17. The semiconducting device of claim 11, wherein the second region forms a portion of the spine region and wherein the spine region is electrically connected to a substrate.

18. The semiconducting device of claim 11, wherein the conductive region comprises Co—Si.

19. The semiconducting device of claim 11, wherein the core region comprises a Flash memory cell.

20. The semiconducting device of claim 11, further comprising a gap region disposed between the un-doped region and an additional conductive layer.

* * * * *